(12) United States Patent
Sauer et al.

(10) Patent No.: US 10,645,835 B1
(45) Date of Patent: May 5, 2020

(54) OPTION CARD LATCH AND BUTTON

(71) Applicant: HEWLETT PACKARD ENTERPRISE DEVELOPMENT LP, Houston, TX (US)

(72) Inventors: Keith Sauer, Houston, TX (US); Kenny Pham, Houston, TX (US); David Paquin, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/260,498

(22) Filed: Jan. 29, 2019

(51) Int. Cl.
*H05K 1/14* (2006.01)
*H05K 7/14* (2006.01)
*G06F 1/18* (2006.01)

(52) U.S. Cl.
CPC .......... *H05K 7/1461* (2013.01); *G06F 1/185* (2013.01); *H05K 7/1418* (2013.01)

(58) Field of Classification Search
USPC ........................................................ 361/737
See application file for complete search history.

(56) References Cited

U.S. PATENT DOCUMENTS

| | | | | |
|---|---|---|---|---|
| 5,155,663 | A * | 10/1992 | Harase | G06K 19/07732 273/148 B |
| 5,889,649 | A * | 3/1999 | Nabetani | G06K 7/0082 361/679.32 |
| 6,616,473 | B2 * | 9/2003 | Kamata | H01R 13/6273 439/352 |
| 6,669,497 | B2 | 12/2003 | Westphall et al. | |
| 7,292,434 | B2 * | 11/2007 | Chi | G06F 1/1616 349/58 |
| 7,381,074 | B1 | 6/2008 | Bridges et al. | |
| 7,679,899 | B2 * | 3/2010 | Hsieh | G06F 1/1616 361/679.38 |
| 8,199,511 | B2 | 6/2012 | Kim et al. | |
| 2016/0259597 | A1 * | 9/2016 | Worley | G06F 3/0688 |
| 2016/0286678 | A1 | 9/2016 | Venugopal et al. | |
| 2017/0168943 | A1 * | 6/2017 | Chou | G06F 12/0833 |
| 2018/0303004 | A1 | 10/2018 | Zhai et al. | |

FOREIGN PATENT DOCUMENTS

CN 207020610 U 2/2018

OTHER PUBLICATIONS

Ryan, T., "How To Install A Graphics Card," Jul. 26, 2017, https://www.pcworld.com/article/2913370/components-graphics/how-to-install-a-graphics-card.html.

* cited by examiner

*Primary Examiner* — Hung S. Bui
(74) *Attorney, Agent, or Firm* — Hewlett Packard Enterprise Patent Department

(57) ABSTRACT

A system, comprising: a slot to accept an option card, wherein the slot includes: a connector to receive the option card; and guide rails to guide the option card into the slot, wherein at least one of the guide rails includes a latch and a button, wherein when the option card is not inserted into the slot and the button is: in a locked position, the latch prevents insertion of the option card into the slot; in an unlocked position, the latch allows insertion of the option card into the slot.

17 Claims, 7 Drawing Sheets

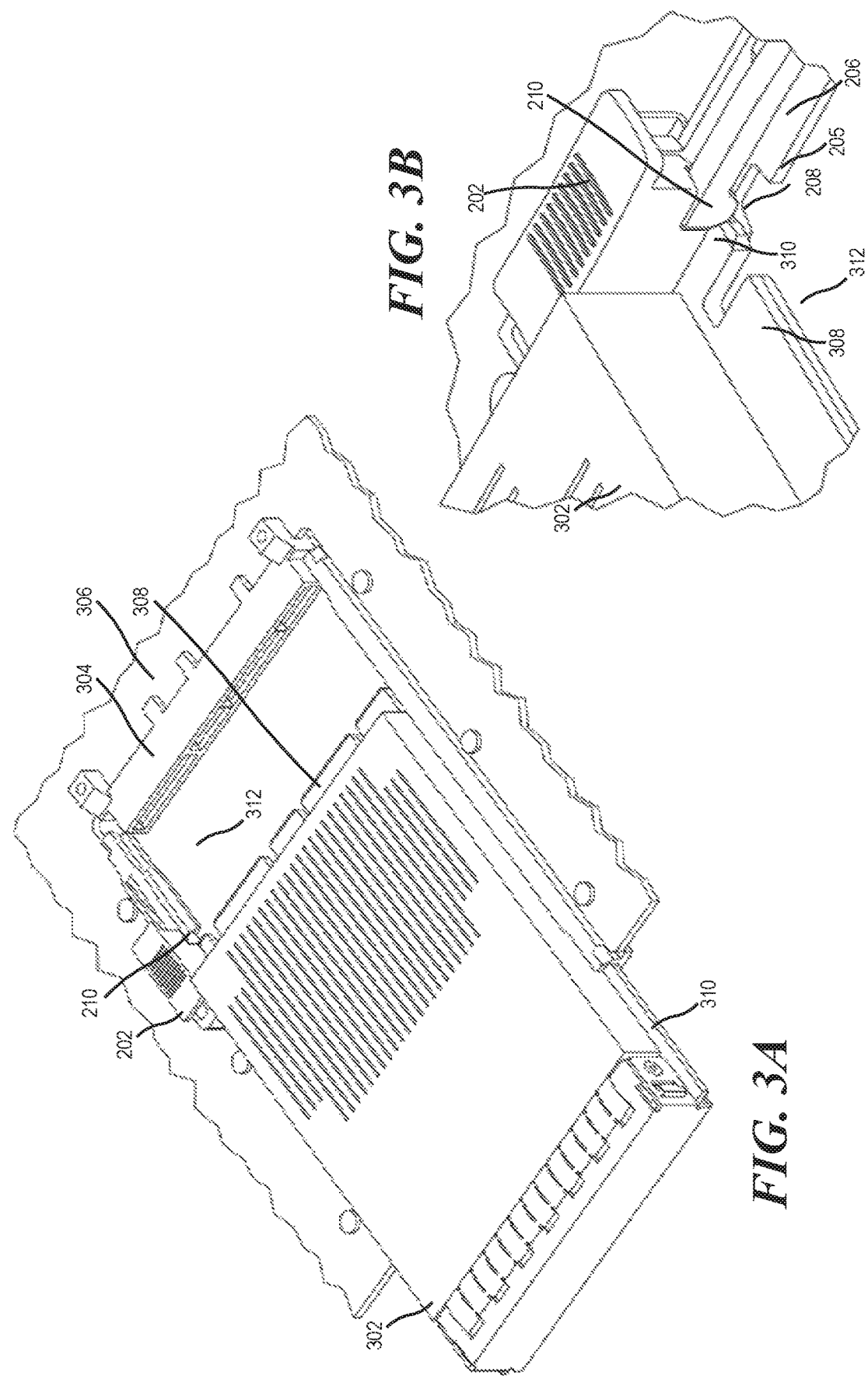

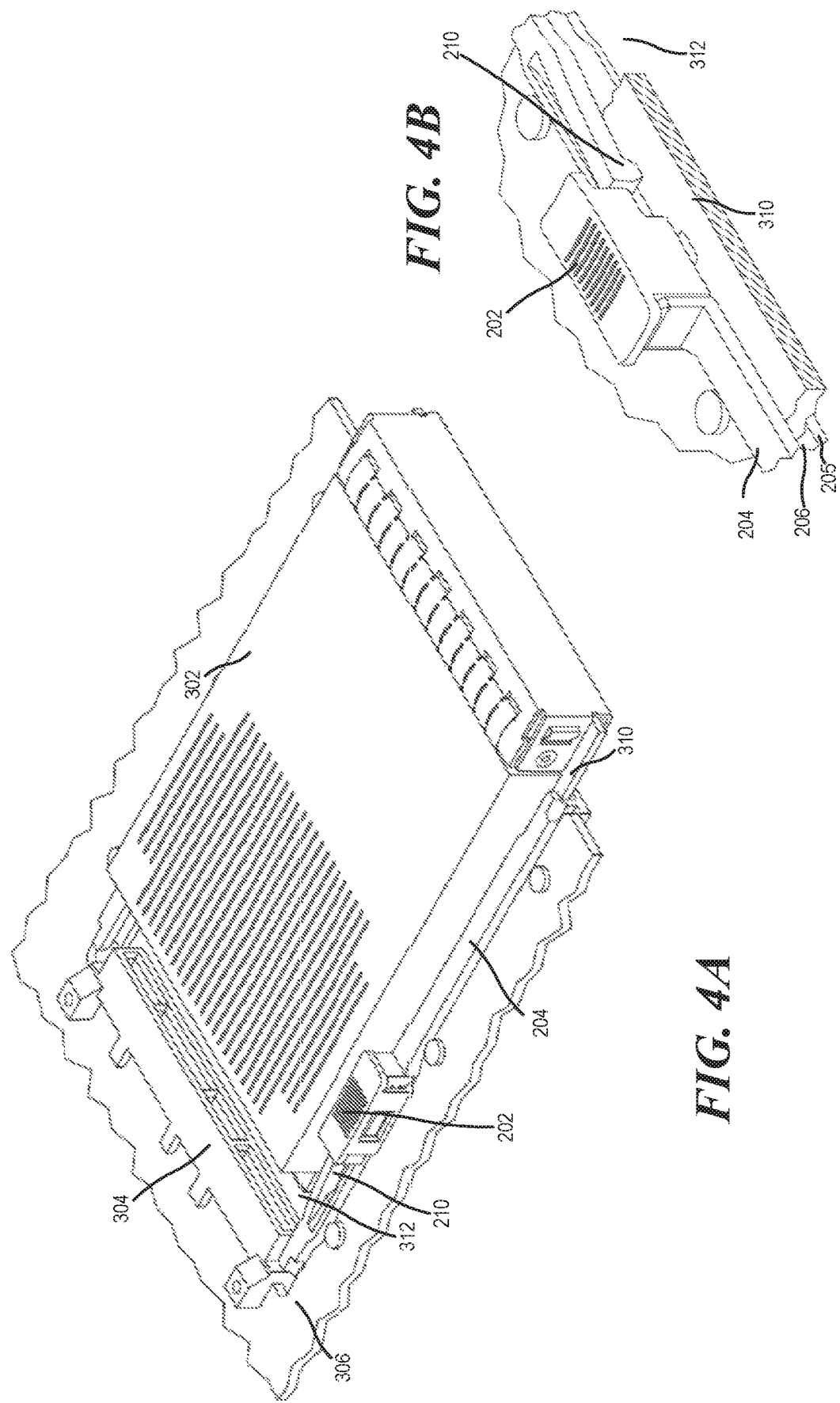

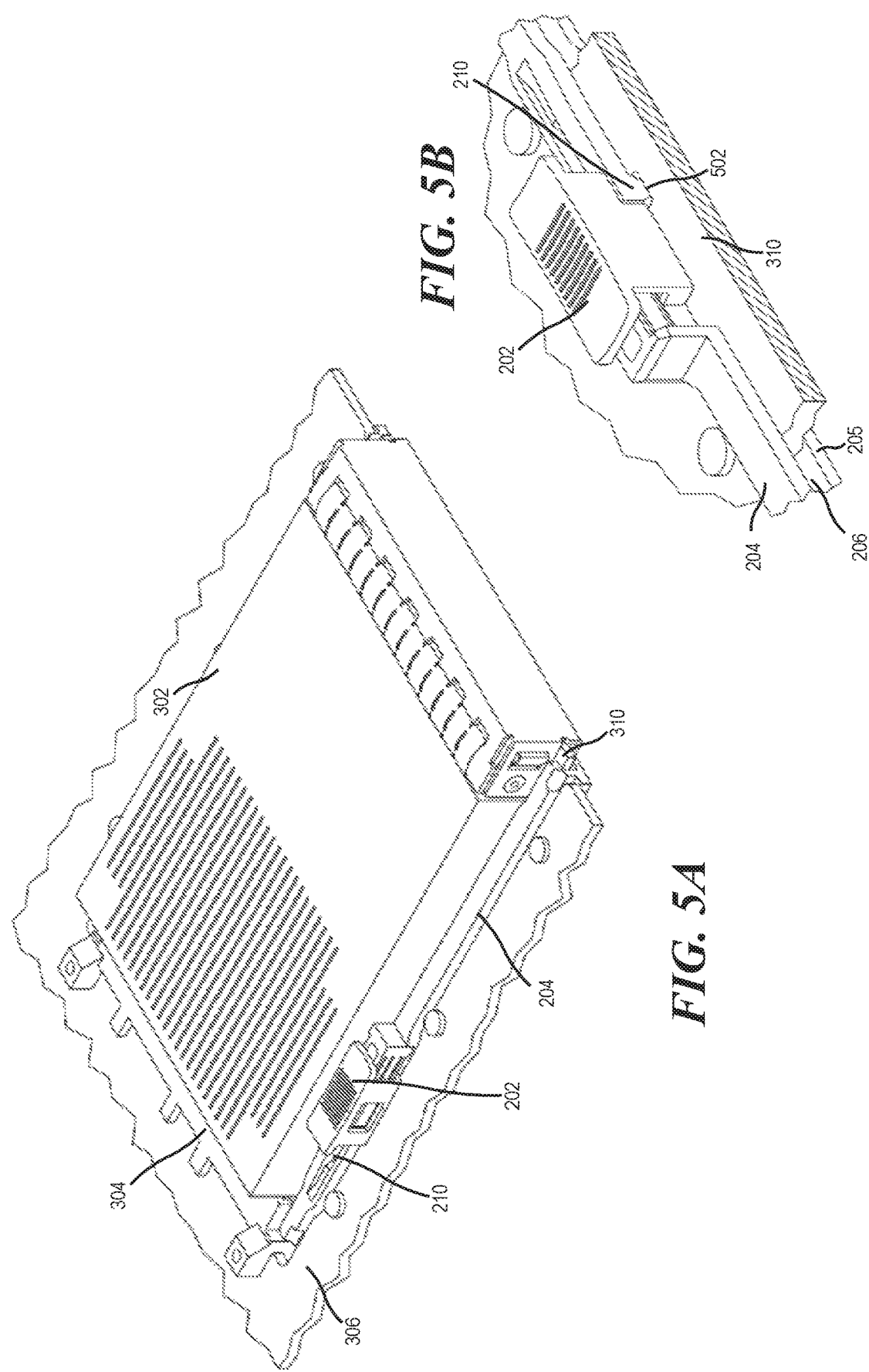

OPTION CARD LATCH AND BUTTON

BACKGROUND

Computing devices may utilize option cards. Newly designed option cards may integrate into a variety of slots in different computing devices. Option cards may or may not be hot pluggable or hot swappable. There are no safeguards to prevent a non-hot pluggable or non-hot swappable option card from being inserted into a computing device while the computing device is operating.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIG. 3A is a schematic view of a slot with a partially inserted option card and at least one guiderail with a button, in a locked position, and a latch, according to an example;

FIG. 3B is a close up schematic view of a slot with a partially inserted option card and at least one guiderail with a button, in a locked position, and a latch, according to an example;

FIG. 4A is a schematic view of a slot with a partially inserted option card and at least one guiderail with a button, in an unlocked position, and a latch, according to an example;

FIG. 4B is a close up schematic view of a slot with a partially inserted option card and at least one guiderail with a button, in an unlocked position, and a latch, according to an example;

FIG. 5A is a schematic view of a slot with a fully inserted option card and at least one guiderail with a button, in a locked position, and a latch, according to an example;

FIG. 5B is a close up schematic view of a slot with a fully inserted option card and at least one guiderail with a button, in a locked position, and a latch, according to an example;

DETAILED DESCRIPTION

Figure 1:
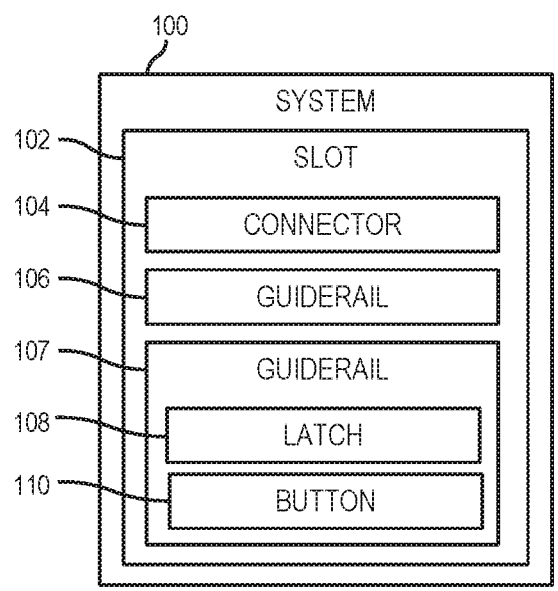
FIG. 1 is a block diagram of a system with a slot, connector, and guiderails, at least one guiderail including a latch and button, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices may utilize option cards. Newly designed option cards may integrate into a variety of slots in different computing devices. Option cards may or may not be hot pluggable or hot swappable. There are no safeguards to prevent a non-hot pluggable or non-hot swappable option card from being inserted into a computing device while the computing device is operating. In other words, while the computing device is powered on and operating or running. For example, a new Open Compute Platform (OCP) option card may insert into a slot with a Small Form Factor-Technology Affiliate-1002 (SFF-TA-1002) connecter integrated into a motherboard. In such examples, there are no means to prevent a user from adding the new OCP option card, which may or may not be hot pluggable or hot swappable, into the slot while the computing device is operating or running. Further, there are no means to prevent a user from removing the new OCP option card, which may or may not be hot pluggable or hot swappable, from the slot while the computing device is operating or running. Additionally, once an option card is inserted into a computing device, there are no means to secure the option card to the computing device.

Examples described herein include a system or computing device with a slot. In such examples, the slot may accept an option card. The option card may be a machine-readable storage medium (such as a solid state drive, flash memory, a hard drive, or any storage related device), a controller, a data processing component, any other networking component, or any other computing device. The slot may include a connector (for example, a peripheral component interconnect express (PCIe) or SFF-TA-1002 interface, connector, slot, or socket) and guiderails. The guiderails may guide the option card into the slot. In other words, the guiderails may allow for ease of insertion or installation of the option card into the slot. Additionally, the guiderails may ensure that the option card properly connects to or is seated in the connector. In such examples, the option card may include an edge that fits into the guiderails or fits into a channel that is part of the guiderails. Further, at least one of the guiderails may include a latch and a button. The button may move to a locked position and an unlocked position. In an unlocked position, the button may allow the latch to flex, thus allowing an option card to be inserted into or removed from the slot. In a locked position, the button may block or prevent the latch from flexing, thus preventing an option card from being removed or added to the slot.

Such examples may allow for prevention of the addition or removal of option cards while a system is running. In other words, the examples noted above may prevent a user from adding or removing a non-hot plug or non-hot swap option card from a system or computing device that is operational or running. In addition, the examples noted above could be utilized to lock an option card in place. For example and as noted above, the option card may include an edge that fits into the guiderails or a channel of the guiderails. Further, the option card may include a notch to align with the latch, when the option card is fully inserted into the slot. When a user fully inserts the option card and pushes the button to a locked position, the button may prevent the latch from flexing, thus preventing removal (whether by a user or other external force) of the option card. In other words, the option card may be locked into place in the slot.

FIG. 1 is a block diagram of a system 100 with a slot 102, connector 104, and guiderails 106, 107, at least one guiderail 107 including a latch 108 and button 110, according to an example. The system 100 (or a computing device) may include a slot 102 (or a gap, cutout, or opening) to accept an option card. The slot 102 may include a connector 104 (or a socket, slot, or interface). The connector 104 may be located at the back or end of the slot 102. The slot 102 may also include guiderails 106, 107. The guiderails 106, 107 may be located on the inside of each side of the slot 102. At least one guiderail 107 may include a latch 108 and a button 110. The latch 108 and button 110 may be located at any point along the guiderail 107. When an option card is not inserted into the slot 102 and the button 110 is in an unlocked position, the latch 108 may allow insertion of the option card. When an option card is not inserted into the slot 102 and the button 110 is in a locked position, the latch 108 may prevent insertion of the option card.

As used herein, a "computing device" may be a storage array, storage device, storage enclosure, server, desktop or laptop computer, computer cluster, node, partition, virtual machine, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory.

As used herein, "printed circuit board" or PCB may refer to a board that mechanically supports and electrically connects components. The board may connect components via tracks, pads, tracing, vias, layers, etching, soldering, and/or various other means.

As used herein, "option card" may refer to a card that is an option or add-on for a computing device. In other words, an option card may include, but not be limited to, an add-in component, a peripheral component, a controller, a PCIe card, a NIC, or a machine-readable storage medium. An option card may be hot pluggable, hot swappable, or neither.

As used herein, "peripheral component interconnect express" or PCIe refers to the high speed serial connection standard of the same name (as in, PCIe). A PCIe card may refer to a PCB that includes a PCIe edge connector or mezzanine connector. In other words, a PCIe card may connect to a computing device via a PCIe connector on a riser on the computing devices motherboard or on a mezzanine connector on the computing devices motherboard.

As used herein, "network interface card" or NIC may refer to a type of option card. A NIC may connect a computing device to a network (intranet or internet). A NIC may include a various number and type of ports. For example, a NIC may include two Ethernet ports. In another example, a NIC may include one fibre channel port. A NIC may be hot pluggable, hot swappable, or neither.

As used herein, "hot plug" may refer to the act of adding a component or components to a system while the system is powered on and/or running. Further, hot plug may include the continued operation of the system without significant interruption when the component or components are added. In other words, a device may be added to a system while the system is operating and the user or the system itself may perform an administrative task, so that the added device can be utilized. Hot plug may also be referred to with terms such as, hot pluggable, hot plugging, or hot pluggability. For example, a device may be noted to be "hot pluggable".

As used herein, "hot swap" may refer to the act of replacing, removing, or adding a component or components while the system is powered on and/or running. Further, hot swap may include the continued operation of the system without interruption. In other words, in response to a hot swap operation (for example, replacing one device with a new device), a system may operate as normal without interruption. Hot swap may also be referred to with terms such as, hot swappable, hot swapping, or hot swappability. In other words, a device may be noted to be "hot swappable".

As noted above, FIG. 1 is a block diagram of a system 100 with a slot 102, connector 104, and guiderails 106, 107, at least one guiderail 107 including a latch 108 and button 110, according to an example. In a further example, the latch 108 may prevent or allow insertion of an option card based upon whether the button 110 is in a locked or unlocked position, respectively. In a further example, when an option card is inserted into the slot 102 and the button 110 is in a locked position, the latch 108 may prevent removal of the option card. When an option card is inserted into the slot 102 and the button 110 is in an unlocked position, the latch 108 may prevent removal of the option card.

In another example, each guiderail 106, 107 may include a latch 108 and a button 110. In such examples, each button 110 may be mechanically independent, as in each button 110 may move independently from the other button 110. In another example, each button 110 may be mechanically linked, as in each button 110 may move in synch with the other button 110. In other words, when one button 110 is moved to a locked or unlocked position, the other button 110 may move to the same position automatically. In another example, movement of the button 110 (whether there is one button 110 or more) may be controlled via an external button, lever, arm, or some other means to actuate the movement of the button 110 external to the system 100.

In another example and as noted above, the option card may include an edge that aligns with the guiderails 106, 107. The guiderails 106, 107 may form a channel (for example, the guiderails 106, 107 may form a C shaped channel). In a further example, the option card may include a notch at some point along the edge of the option card. In such examples, the notch may align with the latch 108 when the option card is fully inserted into the slot 102. In such examples, as the option card is inserted into the slot 102 and as the edge reaches the latch 108, the latch 108 may or may not flex upwards (depending on the position of the button 110). In the case that the button 110 is unlocked, as the option card is inserted, the latch 108 may pass along the top of the option card edge until the notch is reached. Once the notch is reached, the latch 108 may return to a normal position. In the case that the button 110 is locked, as the option card is inserted, the button 110 may prevent the latch 108 from flexing, thus preventing the edge of the option card from moving further into the slot.

In another example, the latch 108 and button 110 may be composed of a plastic material. In another example, the latch 108 may be composed of a material that may retain an original position after being flexed or bent for a period of time.

Figure 2A:
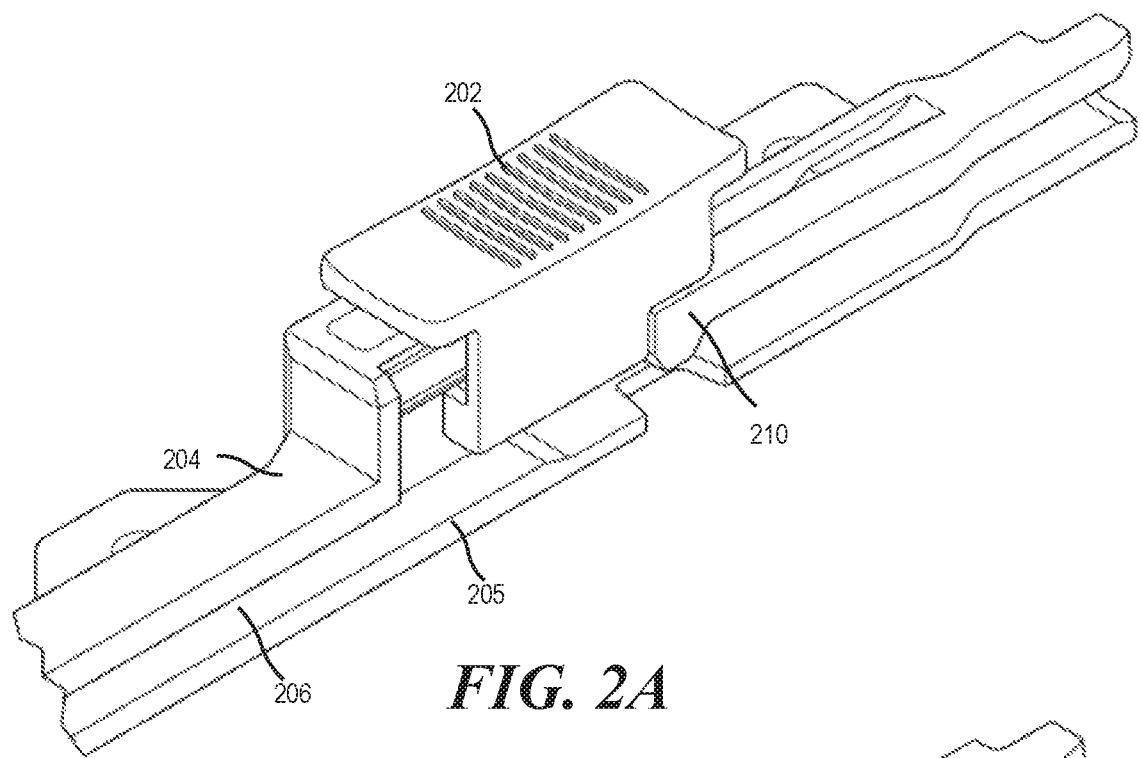
FIG. 2A is a schematic view of a guiderail with a button, in a locked position, and a latch, according to an example.

FIG. 2A is a schematic view of a guiderail 204, 205, 206 with a button 202, in a locked position, and a latch 210, according to an example. Further, no option card is inserted into the guiderail 204, 205, 206. The guiderail 204, 205, 206 may be a part of one side of a slot. In such examples, the guiderail 204, 205, 206 may be formed from a top side 204, a bottom side 205, and a channel 206 or recess. As an option card is inserted into the slot, the channel 206 or recess may accept the edge of the option card.

In another example, the button 202 may be slideable. In another example, the button 202 may be set to a locked position by default. In other words, the button 202 may initially be set to a locked position. In another example, the latch 210 may be a flexible member. In a further example, the latch 210 may flex up upwards when the button 202 is in an unlocked position. In FIG. 2A, the button 202 is in a locked position. In such an example, the button 202 is position over the end of the latch 210. In such examples, as an option card is inserted into the channel 206, the latch 210 may not flex, thus blocking the edge of the option card (in other words, preventing insertion or installation of the option card into the slot).

Figure 2B:
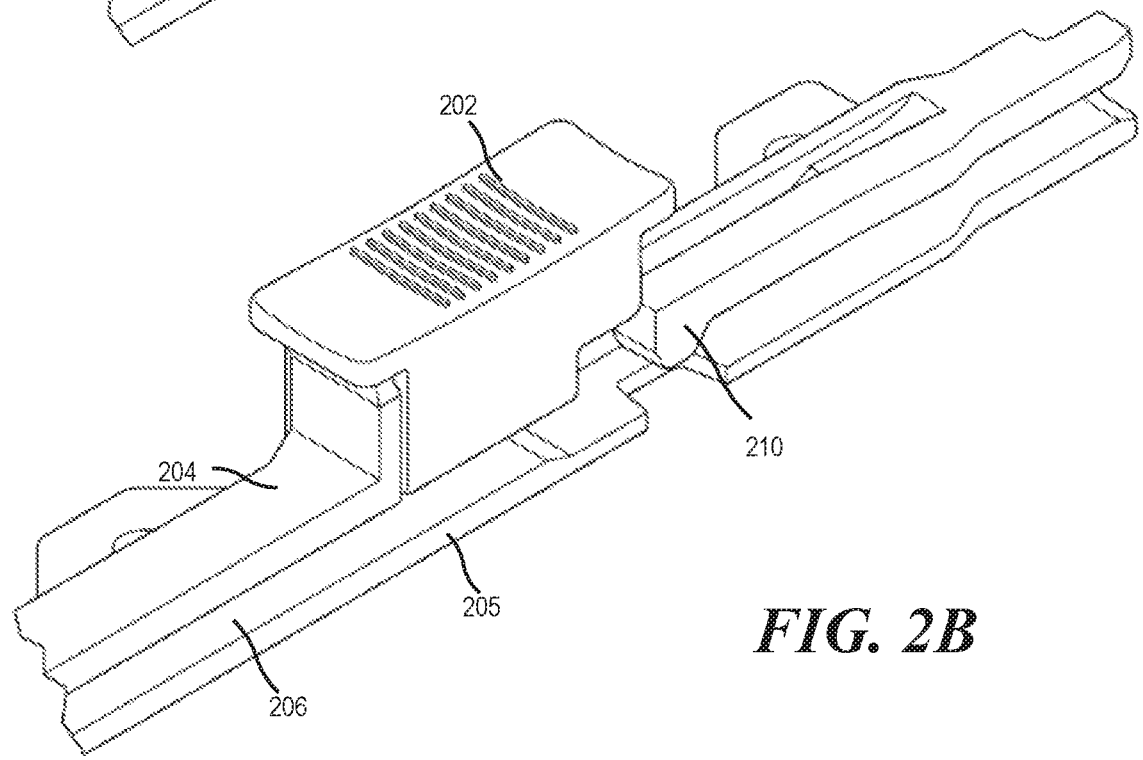
FIG. 2B is a schematic view of a guiderail with a button, in an unlocked position, and a latch, according to an example.

FIG. 2B is a schematic view of a guiderail 204, 205, 206 with a button 202, in an unlocked position, and a latch 210, according to an example. As noted above, FIG. 2B does not include an option card. In an example, the button 202 may be in an unlocked position. The button 202 may be in a position where the button 202 is not situated or positioned over the latch 210. In other words, the button 202 may not prevent the latch 210 from flexing upwards when an option card is inserted into the channel 206. As noted above, the latch 210 may be a flexible member. The latch 210 may flex in such a way to allow an option card to be inserted into the guiderail 204, 205, 206 (for example, the latch 210 may flex upwards as an option card is inserted into the slot).

FIG. 3A is a schematic view of a slot 312 with a partially inserted option card 302 and at least one guiderail with a button 202, in a locked position, and a latch 210, according to an example. FIG. 3A also illustrates the button 210 in a locked position. In such examples and as noted above, the button 202 may be situated or positioned over the latch 210. The button 202 may prevent the latch 210 from flexing upwards as the option card 302 is inserted. In other words, the latch 210 may prevent insertion of the option card 302.

In another example, the option card 302 may be a machine-readable storage medium. In another example, the option card 302 may be a NIC. In another example, the option card 302 may be any other type of computing device or component. In another example, the option card 302 may include an edge 310. The edge 310 may fit into the channel of the guiderail. In a further example, the edge 310 may be comprised of a portion of the PCB of the option card 310. In another example, the option card 302 may include an edge connector 308. In an example, the edge connector 308 may be a SFF-TA-1002 connector, a large form factor (LFF) connector, a PCIe connector, or any other connector capable of being inserted into a slot, interface, connector, or socket of the computing device. The connector 304 (or slot, interface, or socket) may receive the edge connector 308 of the option card 302 when the option card 302 is fully inserted into the computing device.

In another example, the slot 312 may be disposed on a PCB 306. Further, the PCB 306 may integrate into or be a part of a motherboard of a computing device. In another example, the PCB 306 may be integrated into or be a part of a PCIe card, converter board, or another option card with a slot. In other words, the slot may be a part of larger option card. The larger card may allow for the option card 302 to interface to a computing device via a different interface. For example, the option card 302 may connect to a PCIe card via a SFF-TA-1002 connector. The PCIe card may connect to a computing device via a PCIe connection.

FIG. 3B is a close up schematic view of a slot 312 with a partially inserted option card 302 and at least one guiderail with a button 202, in a locked position, and a latch 210, according to an example. In such examples and as noted above, the button 202 may be in a locked position or positioned over the latch 210. As the edge 310 of the option card 302 is inserted into the guiderail the edge 310 of the option card 302 may push against the latch 210. Further, the edge 310 may attempt to force the latch 210 to flex upwards. When the button 202 is in the locked position (for example, pushed forward, situated, or positioned above the latch 210), the button 202 prevents the edge 310 of the option card 302 from forcing the latch 210 upwards, thus preventing the option card 302 from proceeding further into the slot 312.

FIG. 4A is a schematic view of a slot 312 with a partially inserted option card 302 and at least one guiderail with a button 202, in an unlocked position, and a latch 210, according to an example. In such examples, the button 202 may be in an unlocked position (for example, the button 202 may be pushed back, situated, or positioned away from the latch 210). When the button 202 is in an unlocked position, the button 202 may allow the latch 210 to flex upwards when the edge 310 of the option card 302 reaches the latch 210. In an example, FIG. 4A may illustrate the option card 302 being removed from the slot 312 or added to the slot 312. In either scenario, the latch 210 may flex to allow removal or addition, respectively, of the option card 302.

In another example, the button 202 may be slideable between the locked position and unlocked position. In another example, the button 202 may be a push button. The push button may be in a locked position when depressed and an unlocked position when released. Other types of buttons may be utilized to prevent removal and addition of option cards 302. In another example, the part of the guiderail that the button 202 is attached to may include a detent for the locked position and a detent for the unlocked position. The detents may keep the button 202 from sliding from one position to the other without a direct force applied to the button 202. In other words, the detents may keep the button in a static position until a user applies force to the button 202 to move the button 202 to a different position. In another example, a mechanism other than a detent may be utilized to keep the button 202 in a static position.

FIG. 4B is a close up schematic view of a slot 312 with a partially inserted option card and at least one guiderail 204, 205, 206 with a button 202, in an unlocked position, and a latch 210, according to an example. As shown, when the option card is being inserted or removed from the slot 312, the latch 210 may flex upwards. The latch 210, in other words, may allow the edge 310 of the option card to pass through the channel 206.

FIG. 5A is a schematic view of a slot with a fully inserted option card 302 and at least one guiderail with a button 202, in a locked position, and a latch 210, according to an example. In an example, when the option card 302 is fully inserted into the slot, the edge connector 308 of the option card 302 may be fully seated or inserted into connector 304. In another example, once an option card 302 is fully inserted into a slot, the button 202 may be moved from an unlocked position to a locked position (the locked position as shown in FIG. 5A). The button 202 may prevent the latch 210 from allowing the option card 302 to be removed. In other words, a user or some external force applied to the system or computing device may not be able to remove the option card 302.

FIG. 5B is a close up schematic view of a slot with a fully inserted option card 302 and at least one guiderail with a button 202, in a locked position, and a latch 210, according to an example. As noted, when the option card 302 is fully inserted into the slot, the edge connector 308 of the option card 302 may be fully seated or inserted into connector 304. In another example, the edge 310 of the option card may include a notch 502. When the option card is fully inserted in the slot, the notch 502 may align with the end of the latch 210. Further, the latch 210 may, when the button 202 is moved to the locked position, prevent the option card from moving or from being removed from the slot.

Figure 6:
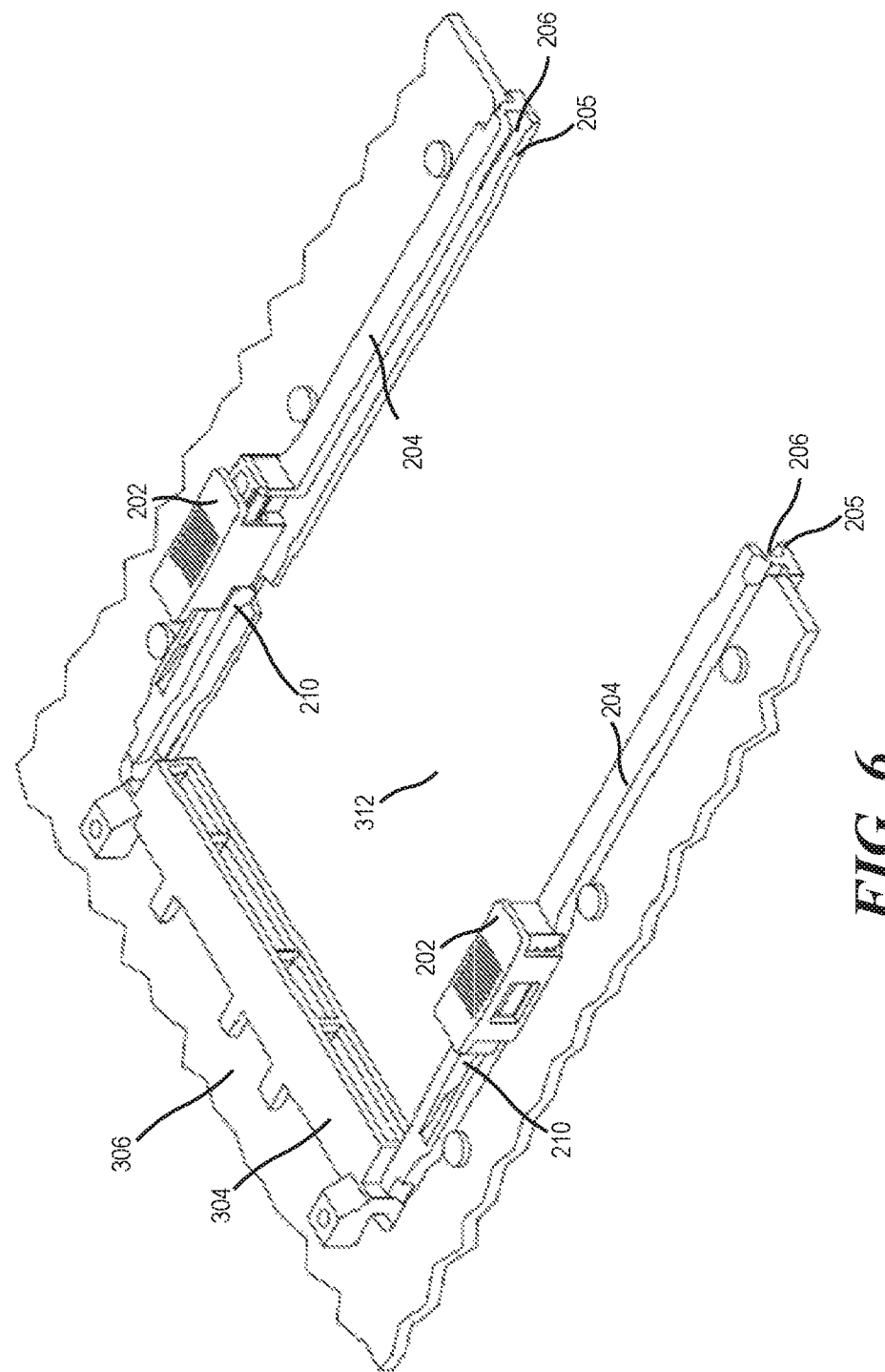
FIG. 6 is a schematic view of a slot with two guiderails, each with a button and a latch, according to an example.

FIG. 6 is a schematic view of a slot 312 with two guiderails 204, 205, 206, each with a button 202 and a latch 210, according to an example. In such examples, both guiderails 204, 205, 206 may include a button 202 and a latch 210. Further, the addition of an extra button 202 and latch 210 may allow for added stability. For example, an option card may not be partially removed when both buttons 202 are locked. Depending on variance in measurements of the slot 312, guiderails 204, 205, 206, option cards, as well the force used to remove an option card, with one locked button 202 the option card may be partially removed at an odd angle. In other words, a user may attempt to remove an option card by pulling the side where there is no button 202 and latch 210. In such examples, if the user pulls hard enough or with enough force, the option card may become partially unseated at that particular side (in other words, unseated at an angle). Adding two buttons 202 may increase stability, as well ensure retention of the option card.

Figure 7:
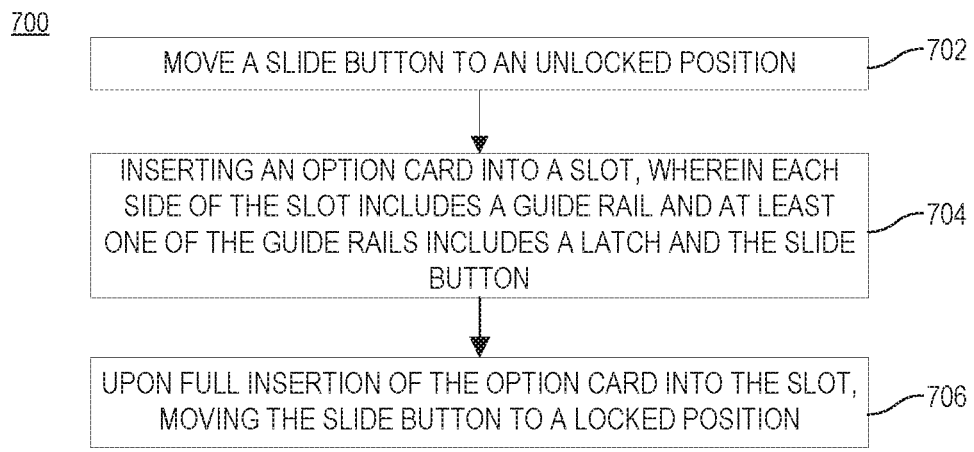
FIG. 7 is a flow chart of a method of adding an option card to a slot and locking the option card in the slot, according to an example.

FIG. 7 is a flow chart of a method of adding an option card to a slot and locking the option card in the slot, according to an example. Although execution of method 700 is described below with reference to system 100 of FIG. 1, other suitable systems or computing devices may be utilized, including, but not limited to, the guiderail of FIG. 200A, the guiderail of FIG. 200B, the system of FIGS. 300A and 300B, the system of FIGS. 400A and 400B, the system of FIGS. 500A and 500B, or the system of FIG. 600. Additionally, implementation of method 700 is not limited to such examples.

At block 702, a slide button (as in, button 110) may be moved to an unlocked position. In an example, a user may move the slide button (i.e., button 110) to an unlocked position from the locked position. In an example, the slide button (i.e., button 110) may be, by default, in a locked position. In another example, the slide button (i.e., button 110) may be actuated (as in moved from one position to another) via a mechanism external to the computing device and/or on the face of the computing device.

At block 704, an option card may be inserted into a slot 102. Further the slot 102 may include guiderails 106, 107. At least one of the guiderails 107 may include a latch 108 and the slide button (i.e., button 110). As noted, the slide button (i.e., button 110) may be moved from one position to another (as in, from a locked position to an unlocked position and from an unlocked position to a locked position). In another example, when the slide button (i.e., button 110) is in the locked position, the slide button (i.e., button 110) may prevent the latch 108 from allowing removal or insertion of the option card from or to, respectively, the slot 102. In another example, when the slide button (i.e., button 110) is in the unlocked position, the slide button (i.e., button 110) may allow the latch 108 to allow removal or insertion of the option card from or to, respectively, the slot 102.

At block 706, upon full insertion of the option card into the slot 102, the slide button (i.e., button 110) may be moved or slid to a locked position. In another example, the slide button (i.e., button 110) may be left in an unlocked position. In another example, the slide button (i.e., button 110) may be moved based on whether the option card is hot swappable, hot pluggable, or neither.

In another example, a user may remove the option card from the slot 102. In such examples, the slide button (i.e., button 110) may be moved from a locked position to an unlocked position. When the slide button (i.e., button 110) is moved to the unlocked position (or if the slide button (i.e., button 110) is already in an unlocked position) then a user may remove the option card.

Although the flow diagram of FIG. 7 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A system, comprising:
   a slot to accept an option card, wherein the slot includes:
      a connector to receive the option card; and
      guide rails to guide the option card into the slot,
         wherein at least one of the guide rails includes a latch and a button,
         wherein the latch is a flexible member and flexes upwards when the option card is inserted into the slot and the button is in an unlocked position,
         wherein when the option card is not inserted into the slot and the button is:
            in a locked position, the latch prevents insertion of the option card into the slot;
            in the unlocked position, the latch allows insertion of the option card into the slot; and wherein when the option card is inserted into the slot and the button is:
  in the locked position, the latch prevents removal of the option card from the slot;
  in an unlocked position, the latch allows removal of the option card from the slot.

2. The system of claim 1, wherein, when the button is in the locked position, the button prevents the latch from flexing upwards to prevent insertion or removal of the option card.

3. The system of claim 1, wherein the option card includes a notch along the edges that insert into the guide rails.

4. The system of claim 3, wherein when the option card is fully inserted into the slot, the notch aligns with the latch.

5. The system of claim 1, wherein the slot is included on a motherboard.

6. The system of claim 1, wherein both guiderails include a latch and button.

7. The system of claim 1, wherein the connector is a small form factor-technology affiliate 1002 (SFF-TA 1002) connector.

8. The system of claim 1, wherein the button is slide-able from the unlocked position to the locked position and the locked position to the unlocked position.

9. A system, comprising:
  a slot to accept an option card, wherein the slot includes:
    a connector to receive an option card; and
    guide rails to guide the option card into the slot,
    wherein at least one of the guide rails includes a latch and a slide button,
    wherein the latch is a flexible member and flexes upwards when the option card is inserted into the slot and the slide button is in an unlocked position,
    wherein, when the slide button is in the locked position, the slide button prevents the latch from flexing upwards to prevent insertion or removal of the option card,
    wherein when the option card is not inserted into the slot and the slide button is:
      in a locked position, the latch prevents insertion of the option card into the slot;
      in an unlocked position, the latch allows insertion of the option card into the slot;
    wherein when the option card is inserted into the slot and the slide button is:
      in the locked position, the latch prevents removal of the option card from the slot;
      in the unlocked position, the latch allows removal of the option card from the slot.

10. The system of claim 9, wherein the slide button is initially placed in a locked position to prevent the hot plugging of the option card.

11. The system of claim 9, wherein both guide rails include a latch and slide button.

12. The system of claim 9, wherein the slot is integrated into a motherboard.

13. The system of claim 9, wherein the slot is integrated into a peripheral component interconnect express (PCIe) card.

14. A method, comprising:
  moving a slide button to an unlocked position;
  inserting an option card into a slot, wherein each side of the slot includes a guide rail and at least one of the guide rails includes a latch and the slide button; and
  upon full insertion of the option card into the slot, moving the slide button to a locked position, wherein, when the slide button is in the locked position and the option card is not inserted into the slot, the slide button is positioned over the latch and prevents the latch from flexing up to allow the option card to be inserted.

15. The method of claim 14, further comprising:
  when the option card is inserted into the slot, moving the slide button to an unlocked position; and
  upon movement of the slide button from the locked position to the unlocked position, removing the option card from the slot.

16. The method of claim 14, wherein, when the slide button is in the locked position and the option card is inserted into the slot, the slide button is positioned over the latch and prevents the latch from flexing up to allow the option card to be removed.

17. The method of claim 14, wherein, when the slide button is in the unlocked position and the option card is not inserted into the slot, the slide button is positioned away from the latch and allows the latch to flex upwards upon insertion of the option card.

* * * * *